United States Patent [19]
Mori et al.

[11] Patent Number: 5,529,745
[45] Date of Patent: Jun. 25, 1996

[54] PREPARATION OF MAGNETOSTRICTIVE MATERIAL

[75] Inventors: Teruo Mori; Tomoko Nakamura, both of Chiba, Japan

[73] Assignee: TDK Corporation, Tokyo, Japan

[21] Appl. No.: 423,982

[22] Filed: Apr. 18, 1995

[30]  Foreign Application Priority Data

Apr. 19, 1994 [JP] Japan ................................. 6-104786

[51] Int. Cl.$^6$ .................................................. B22F 3/00
[52] U.S. Cl. ................................ 419/38; 419/32; 419/39; 419/46
[58] Field of Search ................................ 419/32, 38, 39, 419/46

[56]  References Cited

U.S. PATENT DOCUMENTS

| | | | |
|---|---|---|---|
| 4,152,178 | 5/1979 | Malekzadeh et al. | 148/103 |
| 5,275,688 | 1/1994 | Mori et al. | 156/620.7 |
| 5,357,232 | 10/1994 | Suzuki et al. | 335/215 |
| 5,405,455 | 4/1995 | Kusunoki et al. | 148/103 |

FOREIGN PATENT DOCUMENTS

| | | |
|---|---|---|
| 0405362 | 1/1991 | European Pat. Off. . |
| 1180943 | 7/1989 | Japan . |
| 436401 | 2/1992 | Japan . |

OTHER PUBLICATIONS

Zeitschrift Fur Physikaliische Chemie, Bd. 183, S. 427–435, pp. 1479–1487, 1994, L. Ruiz De Angulo, et al., "Powder Metallurgical Processing of Tb0.27Dy0.73Fe2–x(0.5≧x≧0.1) From Fine Hydride Powder".

*Primary Examiner*—Donald P. Walsh
*Assistant Examiner*—John N. Greaves
*Attorney, Agent, or Firm*—Oblon, Spivak, McClelland, Maier & Neustadt

[57]  ABSTRACT

By compacting in a magnetic field a mixture containing powder raw material A having a composition represented by $(Tb_xDy_{1-x})T_y$ wherein T is at least one metal of Fe, Co, and Ni and $0.30 < x \leq 0.50$ and $1.70 \leq y \leq 2.00$, powder raw material B having a composition represented by $(Dy_{1-t}Tb_t)_zT_{1-z}$ wherein $0 \leq t \leq 0.30$ and $0.40 \leq z \leq 0.80$ and optionally, powder raw material C consisting essentially of element T, and sintering the compact, there is prepared a magnetostrictive material having a composition represented by $(Tb_vDy_{1-v})T_w$ wherein $0.27 \leq v < 0.50$ and $1.70 \leq w \leq 2.00$, with grains oriented along [111] axis. The material having minimal crystalline magnetic anisotropy at room temperature and large magnetostrains is obtained at low cost by powder metallurgy.

4 Claims, 8 Drawing Sheets

DIRECTION OF MAGNETIC FIELD
APPLIED DURING COMPACTING

DIRECTION OF MAGNETIC FIELD
APPLIED DURING COMPACTING

DIRECTION OF MAGNETIC FIELD
APPLIED DURING COMPACTING

DIRECTION OF MAGNETIC FIELD
APPLIED DURING COMPACTING

DIRECTION OF MAGNETIC FIELD
APPLIED DURING COMPACTING

DIRECTION OF MAGNETIC FIELD
APPLIED DURING COMPACTING

PREPARATION OF MAGNETOSTRICTIVE MATERIAL

TECHNICAL FIELD

This invention relates to a method for preparing magnetostrictive materials which change their length under the influence of an external magnetic field.

BACKGROUND

Magnetic materials undergo some elongation or contraction when subjected an external magnetic field to that. This phenomenon is known as magnetostriction. Magnetostriction is utilized in a variety of device applications, for example, displacement controlling or driving actuators, magnetostrictive oscillators for generating ultrasonic waves, ultrasonic delay lines, ultrasonic filters, variable frequency resonators, and various sensors.

Magnetostrictive materials are essentially required to have large magnetostrains. Known magnetostrictive materials having large magnetostrains include, for example, (i) alloys of iron with rare earth elements such as Tb, Sm, Dy, Ho, Er, and Tm as disclosed in U.S. Pat. Nos. 4,375,372, 4,152,178, 3,949,351, and 4,308,474, (ii) alloys of an iron group element and Mn with Tb and Sm as disclosed in U.S. Pat. No. 4,378,258, and (iii) magnetostrictive materials consisting of Fe, Al, Co, and at least one element selected from the group consisting of Ti, V, Cr, Mn, Ni, Cu, Nb, Mo, Ta, W, C, Si, Ge, Sn, B, In, La, Ce, Pr, Nd, Sm, Gd, Tb, Eu, Dy, Ho, Er, Yb, Lu, and Tm and magnetostrictive materials consisting of Tb, Dy, Ho, Fe, and at least one element selected from the groupconsisting of Ti, V, Cr, Mn, Co, Ni, Cu, Nb, Mo, Ta, W, C, Si, Ge, Sn, B, In, La, Ce, Pr, Nd, Sm, Gd, Eu, Er, Yb, Lu, and Tm as disclosed in JP-A 64798/1978. These magnetostrictive materials are intermetallic compounds of Fe and rare earth element R, which are known as $RFe_2$ Laves phase intermetallic compounds, optionally having another element such as a transition metal added thereto. They are called giant-magnetostrictive materials since they have saturation magnetostrictions λs which are at least ten times greater than those of conventional nickel and ferrite base magnetostrictive materials.

Among the $RFe_2$ Laves phase intermetallic compounds, $TbFe_2$ produce large magnetostrains under a strong external magnetic field, for example, of about 20 to 25 kOe, but insufficient magnetostrainS under a weak magnetic field. Modified compounds wherein Tb is partially replaced by Dy, that is, of the formula $(Tb,Dy)Fe_2$ are widely used as magnetostrictive materials capable of producing superior magnetostriction with low magnetic field strength. In particular, magnetostrictive material having $Tb_{0.3}Dy_{0.7}Fe_{2.0}$ crystals is most practical and widespread since it has minimal crystalline magnetic anisotropy at room temperature and a large magnetostriction.

In order to further increase the magnetostriction of these giant-magnetostrictive materials, it is effective to impart anisotropyby orienting grain axes lying in a larger magnetostriction direction. $RFe_2$ Laves phase intermetallic compound grains have larger magnetostriction in the [111] axis direction. Particularly in the above-mentioned $Tb_{0.3}Dy_{0.7}Fe_{2.0}$ grains, the [111] axis is also an axis of easy magnetization.

Single crystal growth techniques are effective for grain orientation. For example, U.S. Pat. No. 4,308,474 discloses a Bridgman method. However, the single crystal growth techniques are very low in productivity and can produce only a limited shape of product as compared with powder metallurgy. Although orientation of [111] axis is described in the patent cited herein, later research works revealed that in the Bridgman method, orientation occurs along [11-2] axis rather than [111] axis. Since [11-2] axis is offset about 19° from [111] axis, the magnetostriction associated with [11-2] axis orientation is reduced to the magnetostriction associated with [111] axis orientation multiplied by cos19°. The patent cited herein describes an example wherein an isotropic polycrystalline alloy prepared by arc melting is subject to grain orientation by a perpendicular zone melt method. Like the single crystal growth technique, the anisotropic orientation by the zone melt method also suffers from very low productivity and a limited freedom of shape, with orientation occurring along [11-2] axis.

On the other hand, the powder metallurgy enables low cost manufacture. U.S. Pat. No. 4,152,178 discloses that an anisotropic material with [111] axis alignment is obtained by compacting a powder of particles having $Tb_{0.3}Dy_{0.7}Fe_{2.0}$ grains in a magnetic field, followed by sintering. However, because of insufficient magnetic anisotropy of $Tb_{0.3}Dy_{0.7}Fe_{2.0}$ grains, a strong magnetic field must be applied in order to align particles. Sometimes particles are not aligned, leaving a problem with respect to the practice of this method.

JP-A 180943/1989 discloses a method involving the steps of separately pulverizing $TbFe_2$ and $DyFe_2$, mixing them, compacting the mixture in a magnetic field, and sintering the compact. It is described therein that both $TbFe_2$ and $DyFe_2$ are easy to align because of greater magnetic anisotropy and convert to a low magnetic anisotropy composition due to diffusion during sintering, resulting in an enhanced response to a magnetic field. However, since the axis of easy magnetization is [111] axis for $TbFe_2$ and [100] axis for $DyFe_2$, an anisotropic material with [111] axis orientation could not be produced by this method in our follow-up test which will be described later.

SUMMARY OF THE INVENTION

An object of the present invention is to produce a magnetostrictive material of $(Tb,Dy)Fe_2$ system having low crystalline magnetic anisotropy at room temperature and a large magnetostriction at a low cost by utilizing powder metallurgy.

According to the present invention, a magnetostrictive material having a composition of the following formula (III) is prepared by compacting a mixture containing a powder raw material A of the following formula (I) and a powder raw material B of the following formula (II) in a magnetic field and sintering the compact. The magnetostrictive material is typically obtained as a polycrystalline body having [111] axis orientation.

$(Tb_xDY_{1-x})T_y$          (I)

$(DY_{1-t}Tb_t)_zT_{1-z}$          (II)

$(Tb_vDy_{1-v})T_w$          (III)

T is at least one metal selected from the group consisting of iron, cobalt, and nickel. Letters x, y, t, z, v, and w representative of atomic ratios of respective elements associated therewith are in the following range.

$0.30 < x \leq 0.50$     $1.70 \leq y \leq 2.00$ $0 \leq t \leq 0.30$     $0.40 \leq z \leq 0.80$ $0.27 \leq v < 0.50$     $1.70 \leq w \leq 2.00$ The mixture optionally contains a powder raw material C consisting essentially of element T. Dysprosium in raw material A and/or dysprosium in raw material B may be at least partially replaced by holmium. Preferably the mixture consists of 50% to less than 100% by weight of raw material A, more than 0% to 40% by weight of raw material B, and 0% to 20% by weight of raw material C.

ADVANTAGES $Tb_{0.3}Dy_{0.7}Fe_{2.0}$ crystals have crystalline magnetic anisotropy which is not large enough to allow for stable orientation along the axis Of easy magnetization during compacting in a magnetic field. This problem might be solved by using raw material A having crystalline magnetic anisotropy which is large enough to allow for sufficient orientation along the axis of easy magnetization during compacting in a magnetic field, with the axis of easy magnetization being [111] axis. However, a sintered product of raw material A is practically unacceptable since it has too much crystalline magnetic anisotropy and shows a poor response when used as a magnetostrictive material. Then according to the present invention, a mixture of raw materials A and B and optional raw material C is shaped in a magnetic field and then sintered. Sintering causes diffusion of elements, resulting in a polycrystalline magnetostrictive material having a composition close to $Tb_{0.3}Dy_{0.7}Fe_{2.0}$. This polycrystalline magnetostrictive material has large magnetostriction due to the [111] axis orientation of raw material A maintained, appropriate crystalline magnetic anisotropy, and good response to a magnetic field.

BRIEF DESCRIPTION OF THE DRAWINGS

The above and other objects, features and advantages of the present invention will be better understood by reading the following detailed description taken in conjunction with the accompanying drawings.

BEST MODE FOR CARRYING OUT THE INVENTION

Figure 1A:
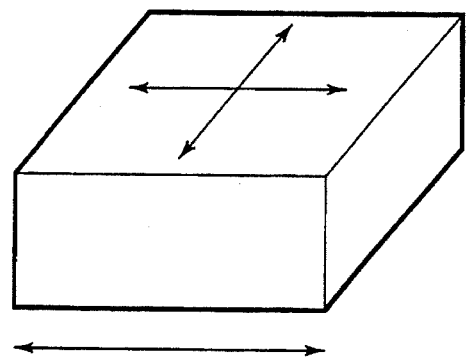
FIG. 1(a) illustrates the direction of magnetostriction measurement on a model sample with respect to the direction of a magnetic field applied during compacting.

According to the present invention, a magnetostrictive material is obtained as a polycrystalline body having a composition of the following formula.

$$(Tb_vDy_{1-v})T_w \qquad (III)$$

In formula (III), T is iron (Fe), cobalt (Co) or nickel (Ni) or a mixture of two or more. Part of T may be replaced by Mn, Cr and Mo because these elements form alloys with the rare earth elements which contribute to strength improvements. Letters v and w representative of atomic ratios of Tb and T, respectively, are in the range:

$0.27 \leq v < 0.50$, preferably $0.27 \leq v \leq 0.40$ and $1.70 \leq w \leq 2.00$, preferably $1.80 \leq w \leq 1.97$. With too small values of v, magnetostriction in a low-temperature region below room temperature is insufficient. With too large values of v, magnetostriction in a room temperature region is insufficient. Too smaller values of w lead to more contents of rare earth-rich phases whereas too large values of w lead to formation of phases other than $(Tb, Dy)T_2$ such as $(Tb,Dy)T_3$ phase, both resulting in reduced magnetostriction.

According to the present invention, the magnetostrictive material defined above is prepared by powder metallurgy using at least two raw materials. More particularly, a mixture of a powder of raw material A and a powder of raw material B or a mixture of a powder of raw material A, a powder of raw material B, and a powder of raw material C is compacted in a magnetic field and then sintered.

Raw material A has a composition of the following formula.

$$(Tb_xDY_{1-x})T_y \qquad (I)$$

In formula (I), letters x and y representative of atomic ratios of Tb and T, respectively, are in the range:

$0.30 < x \leq 0.50$, preferably $0.33 \leq x \leq 0.50$ and $1.70 \leq y \leq 2.00$, preferably $1.90 \leq y \leq 2.00$.

With too small values of x, [111] axis orientation is difficult. Especially when x is less than 0.30, orientation along [100] axis will occur. With too large values of x, the proportion of raw material B blended must be increased and in turn, the proportion of raw material A in the entire raw material mixture is decreased, resulting in a low degree of [111] axis orientation after sintering. With too small values of y, the proportion of raw material C blended must be increased and in turn, the proportion of raw material A in the entire raw material mixture is decreased, resulting in a low degree of [111] axis orientation after sintering. Too large values of y lead to formation of iron rich phases other than $(Tb, Dy)T_2$ such as $(Tb, Dy)T_3$ phase, which precludes alignment during compacting in a magnetic field, resulting in reduced orientation after sintering. The $(Tb,Dy)T_3$ phase can be left after sintering, resulting in reduced magnetostriction.

T in raw material A is at least one element of iron (Fe), cobalt (Co) and nickel (Ni) as defined above. Preferably T is iron alone while part of iron may be replaced by Co and/or Ni. Since Co and Ni increases magnetic anisotropy, but lowers magnetic permeability, it is preferred that Fe/T is at least 70 atom%, especially at least 80 atom%.

Raw material B has a composition of the following formula.

$$(DY_{1-t}Tb_t)_zT_{1-z} \qquad (II)$$

In formula (II), letters t and z representative of atomic ratios of Tb and DyTb, respectively, are in the range:

$0 \leq t \leq 0.30$ and $0.40 \leq z \leq 0.80$, preferably $0.60 \leq z \leq 0.70$. With z outside the range, raw material B will have a higher melting point, failing to produce a dense sintered body. Raw material B is used for the purpose of reducing Tb/(Tb+Dy) of raw material A. If raw material B with large values of t is used, the proportion of raw material B blended must be increased and in turn, the proportion of raw material A in the entire raw material mixture is relatively decreased, resulting in a low degree of orientation after sintering. For this reason, t=0 is most preferred. More specifically, use of $Dy_2T$ as raw material B is most preferred.

In raw material B, at last a part of dysprosium (Dy) may be replaced by holmium (Ho). Also in raw material A, at least a part of dysprosiummay be replaced by holmium. Since holmium functions to reduce crystalline magnetic anisotropy, the percent replacement of Dyby Ho in raw material A, that is Ho/(Dy+Ho), should preferably be up to 20 atom%. Also the percent replacement of Dy by Ho in the final composition or magnetostrictive material composition, that is Ho/(Dy+Ho), should preferably be up to 55 atom% in order to preclude any lowering of saturation magnetostriction. When dysprosium (Dy) in raw materials A and B is replaced by holmium (Ho), formula (III) representing the final composition is considered as having Dy replaced by Ho.

Part of terbium (Tb) in raw material A and/or part of terbium in raw material B may be replaced by at least one of rare earth elements exclusive of Tb, Dy and Ho, which is represented by $R'$, hereinafter. Since $R'$ generally functions to reduce magnetostriction, the percent replacement of Tb by $R'$ in the final composition, that is $R'/(Tb+Rl)$, should preferably be up to 12.5 atom%. Although a choice of $R'$ is not critical, replacement of terbium by at least one element of neodymium (Nd), praseodymium (Pr), gadolinium (Gd), and yttrium (Y) is effective for reducing the temperature dependence of magnetostriction. When terbium in the raw materials is replaced by $R'$, formula (III) representing the final composition is considered as having Tb replaced by $R'$.

T in raw material B is at least one element of iron (Fe), cobalt (Co) and nickel (Ni) as defined above. No other particular limit is imposed on the selection of T. Those substances represented by $(Dy, Tb)_2Fe$ wherein at least a part of Fe is replaced by Co and/or Ni are so easily pulverizable as to minimize oxidation during the pulverizing step, leading to larger magnetostrains.

Raw material C consisting essentially of element T is added to the mixture if necessary to accomplish the desired final composition.

The ratio of the respective raw materials in the mixture is not particularly limited insofar as the final composition represented by formula (III) is obtained. Provided that represents a weight percentage of raw material A, b represents a weight percentage of raw material B, and c represents a weight percentage of raw material C in the mixture, these parameters are preferably in the range:

$50 \leq a < 100$, more preferably $6023 a \leq 95$, $0 < b \leq 40$, more preferably $5 \leq b \leq 30$, $0 \leq c \leq 20$, more preferably $0 \leq c \leq 10$, and $a+b+c=100$.

If a is too low, that is, if the mixture contains less than 50 wt% of raw material A which is readily aligned during compacting in a magnetic field, the sintered material would have a low degree of grain orientation. If a is too high, which means that the composition of raw material A must be close to the final composition, the use of raw material A, which aims to facilitate orientation in a magnetic field, would become meaningless. Since raw material B serves as an eutectic during sintering, if b is too low, the progress of sintering would be retarded, failing to produce a fully dense magnetostrictive material. Too high values of b are not preferred because the value of a becomes too low. Too high values of c are not preferred because the value of a becomes too low.

Raw materials A, B, and C are used in powder particle form. The mean particle size of the particulate raw materials is not particularly limited and may be properly selected so as to achieve desired magnetostrictive properties after sintering. Preferably, the particulate raw materials have a mean particle size of about 1 to 100 μm, more preferably about 5 to 20 μm. Powder with a too small mean particle size is susceptible to oxidation whereas a too large mean particle size would retard sintering reaction, resulting in a less increased density. The mean particle size is as measured by Subsieve Sizer manufactured by Fisher Co.

In a magnetic field, the mixture is shaped or compacted into a compact under pressure. The magnetic field applied preferably has a strength of at least about 3 kOe, more preferably at least about 6 kOe. The compacting pressure is preferably at least about 0.5 t/cm², more preferably at least about 3 t/cm². The direction of the applied magnetic field may be either parallel or perpendicular to the direction of the applied pressure.

Next, the compact is sintered under suitable conditions, often at a temperature of about 900° C. or higher, preferably about 1,100° to 1,200° C., for about 1 to about 10 hours. The sintering atmosphere may be a non-oxidizing atmosphere of Ar gas, for example, or vacuum.

In this way, the magnetostrictive material is obtained as a polycrystalline body in which grains are oriented along [111] axis so that the maximum magnetostriction may be exerted. The magnetostrictive material preferably has a mean grain size of at least about 10 μm. With a too smaller mean grain size, the material would have low magnetic susceptibility to an external magnetic field due to grain boundary stresses. Although there is no need to set an upper limit of mean grain size, it is usually less than about 200 μm when particulate raw materials having a mean particle size in the above-defined range are used.

EXAMPLE

Examples of the present invention are given below by way of illustration and not by way of limitation.

Sample Nos. 1–6

Magnetostrictive material samples, Nos. 1 to 6, as reported in Table 1 were prepared by powder metallurgy. The raw materials used had the composition shown in Table 1. Raw materials A, B, and C were mixed and pulverized by a dry oscillating mill in an argon gas atmosphere and then by a wet oscillating mill in toluene until a mean particle size of 7 to 20 μm was reached. The mixing percents a, b, and c of the respective raw materials are shown in Table 1. The pulverized mixture was dry compacted in a magnetic field and then sintered into a magnetostrictive material sample of rectangular shape dimensioned 10 mm×10×mm×8 mm. The compacting pressure was 6 t/cm². The strength of the magnetic field applied during compacting is shown in Table 1. The magnetic field was applied perpendicular to the direction of the compacting pressure. An exception was sample No. 1 which was compacted in the absence of a magnetic field. It is evident that except for the magnetic field strength during compacting, the parameters reported in Table 1 are the same for all the samples. Sintering was effected in an argon gas atmosphere at 1,180° C. for one hour.

The samples were measured for magnetostriction by means of a strain gauge. The magnetic field applied during magnetostriction measurement had a strength (H) of 1 kOe or 10 kOe. As shown in FIG.1 (a), magnetostriction was measured in two directions parallel and perpendicular to the direction of the magnetic field applied during compacting, and these are designated magnetostrictions "∥" and "⊥", respectively. The results are shown in Table 1.

Figure 2:
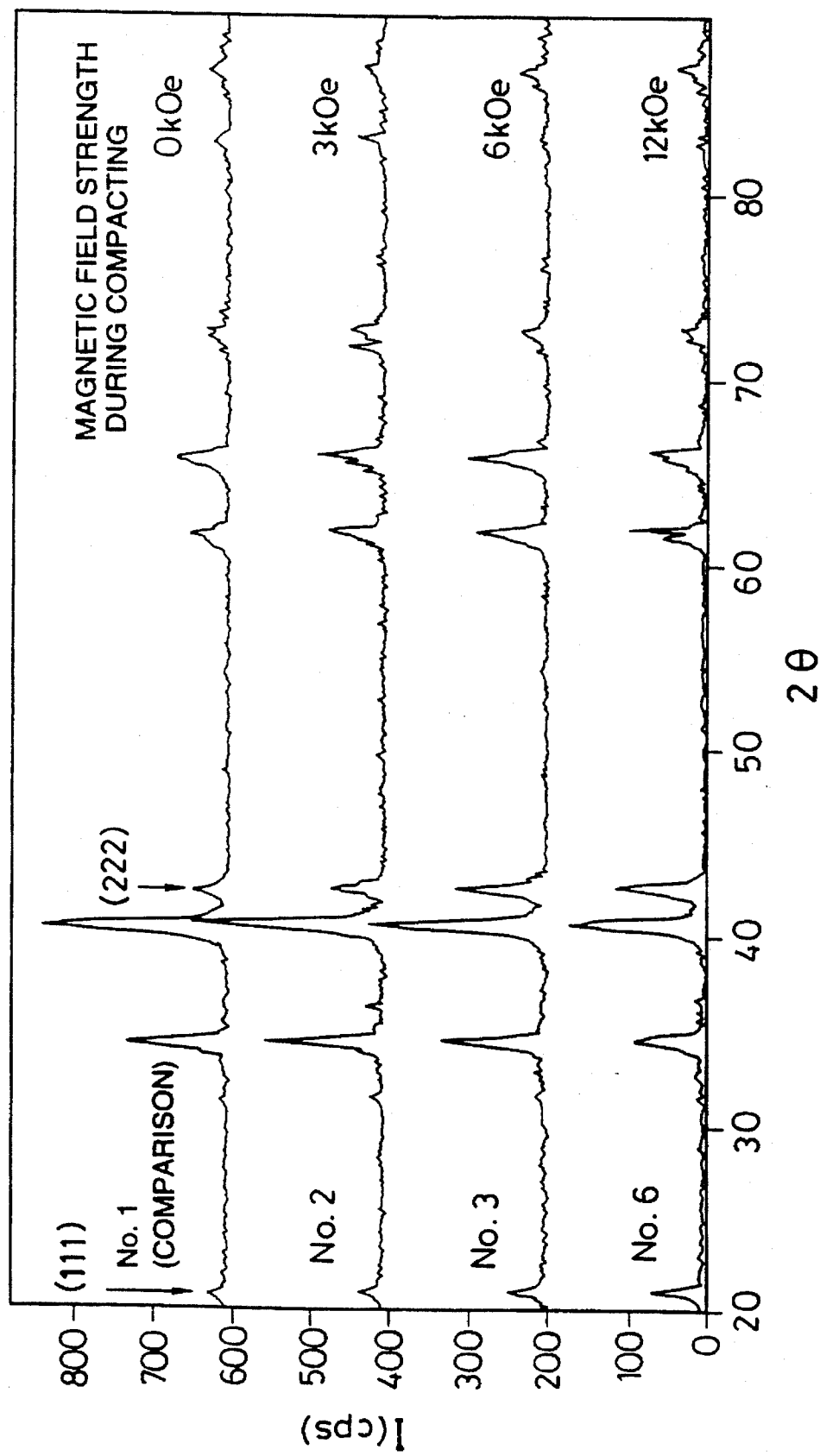
FIG. 2 shows the X-ray diffraction patterns of magnetostrictive material sample Nos. 1, 2, 3, and 6 in Table 1, with the measurement plane being perpendicular to the direction of a magnetic field applied during compacting.

It is seen from FIG. 2 that the peak at 2θ=~20.9° in (111) plane and the peak at 2θ=~42.6° in (222) plane increase their intensity as the strength of the magnetic field applied during compacting increases, indicating that compacting in a magnetic field induced orientation along [111] axis. It is evident from Table 1 that the magnetostrictions ∥ increases as the strength of the magnetic field applied during compacting increases.

TABLE 1

| Sample No. | Raw material A Tb | Raw material A Dy | Raw material A Fe | Raw material B | Raw material C | Mixing ratio (wt %) a | b | c | Final composition Tb | Dy | Fe | Magnetic field strength during compacting (kOe) | Magnetostriction H = 1kOe ∥ | ⊥ | H = 10kOe ∥ | ⊥ |
|---|---|---|---|---|---|---|---|---|---|---|---|---|---|---|---|---|
| 1X | 0.37 | 0.63 | 1.95 | Dy$_2$Fe | Fe | 82.6 | 13.6 | 3.8 | 0.30 | 0.70 | 1.85 | 0* | 550 | 550 | 990 | 970 |
| 2 | 0.37 | 0.63 | 1.95 | Dy$_2$Fe | Fe | 82.6 | 13.6 | 3.8 | 0.30 | 0.70 | 1.85 | 3 | 590 | 580 | 1060 | 1010 |
| 3 | 0.37 | 0.63 | 1.95 | Dy$_2$Fe | Fe | 82.6 | 13.6 | 3.8 | 0.30 | 0.70 | 1.85 | 6 | 810 | 550 | 1230 | 960 |
| 4 | 0.37 | 0.63 | 1.95 | Dy$_2$Fe | Fe | 82.6 | 13.6 | 3.8 | 0.30 | 0.70 | 1.85 | 8 | 780 | 570 | 1220 | 1000 |
| 5 | 0.37 | 0.63 | 1.95 | Dy$_2$Fe | Fe | 82.6 | 13.6 | 3.8 | 0.30 | 0.70 | 1.85 | 10 | 850 | 570 | 1280 | 1020 |
| 6 | 0.37 | 0.63 | 1.95 | Dy$_2$Fe | Fe | 82.6 | 13.6 | 3.8 | 0.30 | 0.70 | 1.85 | 12 | 810 | 600 | 1240 | 1020 |

Figure 1B:
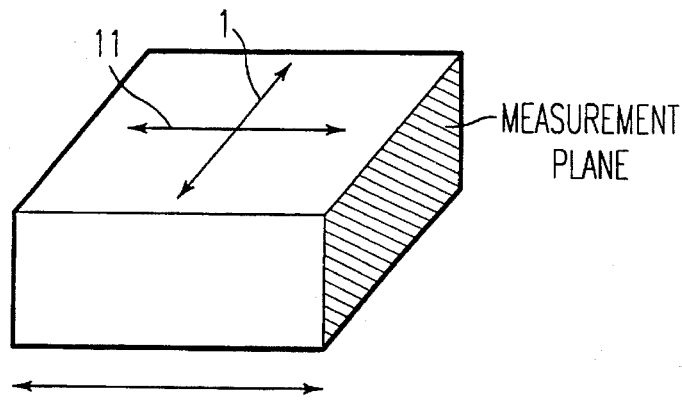
FIGS. 1(b) and 1(c) illustrate the surfaces of a model sample subject to X-ray diffraction analysis with respect to the direction of a magnetic field applied during compacting.

Note:
All the parameters are identical except for the magnetic field strength during compacting.
X:comparison
*outside the scope of the invention FIG. 2 shows the X-ray diffraction patterns of magnetostrictive material sample Nos. 1, 2, 3, and 6. X-ray diffraction analysis was performed on the measurement plane of a sample which is perpendicular to the direction of the magnetic field applied during compacting as shown in FIG. 1(b).

Next magnetostrictive material samples as shown in Table 2 were prepared.

TABLE 2

| Sample No. | Raw material A Tb | Raw material A Dy | Raw material A Fe | Raw material B | Raw material C | Mixing ratio (wt %) a | b | c | Final composition Tb | Dy | Fe | Magnetostriction H = 1kOe ∥ | ⊥ | H = 10kOe ∥ | ⊥ |
|---|---|---|---|---|---|---|---|---|---|---|---|---|---|---|---|
| 7 | 0.35 | 0.65 | 1.90 | Dy$_2$Fe | Fe | 87.0 | 10.4 | 2.6 | 0.30 | 0.70 | 1.82 | 750 | 620 | 1180 | 1070 |
| 8 | 0.40 | 0.60 | 1.90 | Dy$_2$Fe | Fe | 76.2 | 17.7 | 6.1 | 0.30 | 0.70 | 1.82 | 650 | 530 | 1240 | 1045 |
| 9 | 0.45 | 0.55 | 1.90 | Dy$_2$Fe | Fe | 67.7 | 24.1 | 8.2 | 0.30 | 0.70 | 1.82 | 670 | 460 | 1100 | 980 |
| 10 | 0.50 | 0.50 | 1.90 | Dy$_2$Fe | Fe | 60.8 | 29.0 | 10.2 | 0.30 | 0.70 | 1.82 | 570 | 480 | 1050 | 1000 |
| 11X | 0.60** | 0.40 | 1.90 | Dy$_2$Fe | Fe | 50.7 | 35.4 | 13.9 | 0.30 | 0.70 | 1.82 | 425 | 430 | 1025 | 1025 |
| 12X | 0.80** | 0.20 | 1.90 | Dy$_2$Fe | Fe | 37.9* | 44.3* | 17.8 | 0.30 | 0.70 | 1.82 | 340 | 350 | 1020 | 1015 |
| 13 | 0.37 | 0.63 | 1.80 | Dy$_2$Fe | Fe | 80.2 | 13.3 | 6.5 | 0.30 | 0.70 | 1.85 | 640 | 310 | 1260 | 1110 |
| 14 | 0.37 | 0.63 | 2.00 | Dy$_2$Fe | Fe | 83.6 | 13.3 | 3.1 | 0.30 | 0.70 | 1.85 | 700 | 530 | 1270 | 1050 |
| 15X | 0.37 | 0.63 | 2.15** | Dy$_2$Fe | Fe | 86.2 | 13.3 | 0.5 | 0.30 | 0.70 | 1.85 | 280 | 300 | 900 | 850 |
| 16 | 0.37 | 0.63 | 1.95 | Dy$_2$Ni | Fe | 82.6 | 13.6 | 3.8 | 0.30 | 0.70 | 1.85[1] | 815 | 525 | 1350 | 1105 |
| 17 | 0.37 | 0.63 | 1.95 | Dy$_2$Co | Fe | 82.6 | 13.6 | 3.8 | 0.30 | 0.70 | 1.85[2] | 840 | 660 | 1360 | 1225 |
| 18 | 0.37 | 0.63 | 1.95 | Dy$_2$(Fe$_{0.5}$Co$_{0.5}$) | Fe | 82.6 | 13.6 | 3.8 | 0.30 | 0.70 | 1.85[3] | 840 | 625 | 1330 | 1185 |
| 19 | 0.37 | 0.63 | 1.95[4] | Dy$_2$Co | Fe | 76.8 | 18.2 | 5.0 | 0.30 | 0.70 | 1.82[5] | 680 | 510 | 1380 | 1110 |
| 20 | 0.45 | 0.55 | 1.95 | Dy$_2$Fe | Fe | 79.9 | 16.1 | 4.0 | 0.35 | 0.65 | 1.82 | 670 | 530 | 1340 | 1240 |
| 21 | 0.45 | 0.55 | 1.95 | Dy$_2$Fe | Fe | 91.3 | 8.1 | 0.6 | 0.40 | 0.60 | 1.82 | 660 | 480 | 1410 | 1160 |
| 22 | 0.50 | 0.50 | 1.95 | Dy$_2$Fe | Fe | 82.1 | 14.6 | 3.3 | 0.40 | 0.60 | 1.82 | 660 | 480 | 1390 | 1240 |
| 23X | 0.30** | 0.70 | 1.90 | — | — | 100 | — | — | 0.30 | 0.70 | 1.90 | 290 | 250 | 880 | 870 |
| 24X | TbFe$_{1.9}$ (30 wt %) + DyFe$_{1.9}$ (70 wt %) | | | | | | | | 0.30 | 0.70 | 1.90 | 160 | 310 | 690 | 865 |

Note:
For all the samples, a magnetic field of 12 kOe strength was applied during compacting.
[1] Fe$_{0.95}$Ni$_{0.05}$
[2] Fe$_{0.95}$Co$_{0.05}$
[3] Fe$_{0.97}$Co$_{0.03}$
[4] Fe$_{0.9}$Co$_{0.1}$
[5] Fe$_{0.85}$Co$_{0.15}$
X:comparison
**outside the scope of the invention
*outside the preferred scope of the invention Sample Nos. 7 to 12

Figure 1C:
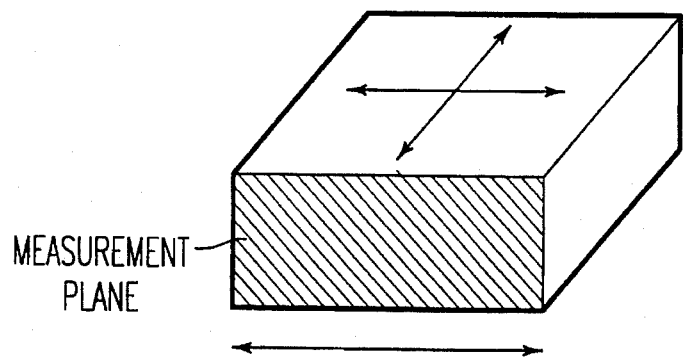
Figure 3:
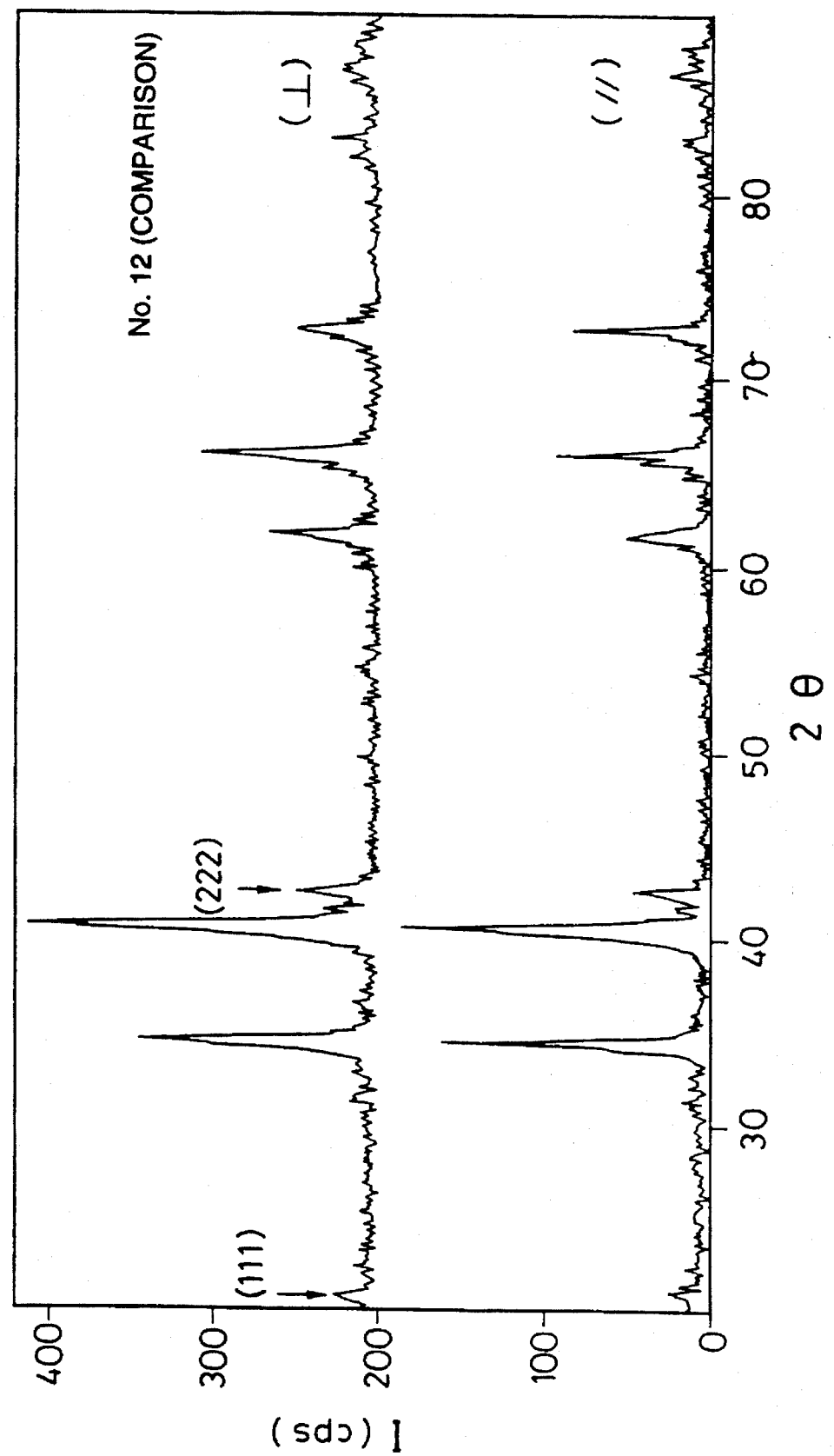
FIGS. 3, 4, 5, 6, 7, and 8 show the X-ray diffraction patterns of magnetostrictive material sample Nos. 12, 15, 19, 22, 23, and 24 in Table 2. In all these charts, the upper pattern (⊥) corresponds to the measurement plane perpendicular to the direction of a magnetic field applied during compacting, and the lower pattern (∥) corresponds to the measurement plane parallel to the direction of a magnetic field applied during compacting.

They had the same final composition except that the atomic ratio of Tb relative to rare earth elements in raw material A was different. These samples were prepared by the same procedure as sample No. 6 in Table 1 except for the composition of raw material A and the mixing ratio of raw materials. It is noted that for these samples, the sintering temperature was selected in the range between 1,150° C. and 1,200° C. pursuant to the composition. FIG. 3 shows the X-ray diffraction patterns of sample No. 12. The upper chart ($\perp$) in FIG. 3 was obtained when the measurement plane of the sample was perpendicular to the direction of the magnetic field applied during compacting as shown in FIG. 1(b). The lower chart ($\|$) in FIG. 3 was obtained when the measurement plane of the sample was parallel to the direction of the magnetic field applied during compacting as shown in FIG. 1(c). The same applies to all the X-ray diffraction patterns of the remaining samples to be described later.

It is evident from Table 2 that when the atomic ratio of Tb relative to rare earth elements in raw material A exceeds 0.50, no substantial anisotropy of magnetostriction is observed and the magnetostriction ($\|$) is small. FIG. 3 relating to sample No. 12 having a Tb atomic ratio of 0.8 shows that the peaks in (111) plane and the peaks in (222) plane are substantially equal in both the perpendicular ($\perp$) and parallel ($\|$) directions, with no orientation along [111] axis being observed. Also in sample No. 11, no orientation along [111] axis was observed like sample No. 12. It is believed that in sample Nos. 11 and 12, no orientation occurred after sintering because of the too low mixing percentage a of raw material A. In the X-ray diffraction patterns of sample Nos. 7 to 10, orientation along [111] axis was observed.

Sample Nos. 13 to 15

Figure 4:
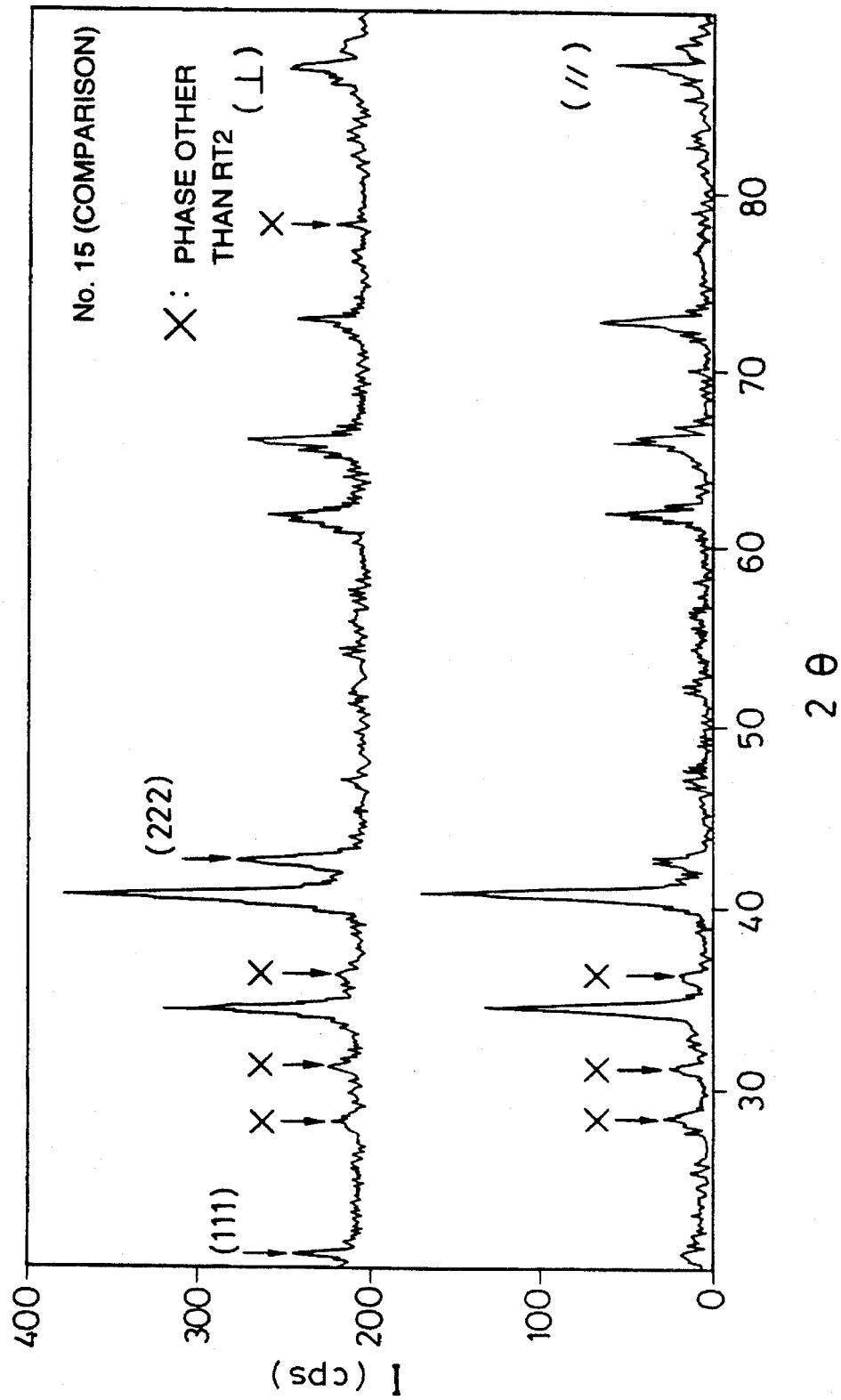

They had the same final composition except that the atomic ratio of Fe in raw material A was different. These samples were prepared by the same procedure as sample No. 6 in Table 1 except for the composition of raw material A and the mixing ratio of raw materials. FIG. 4 shows the X-ray diffraction patterns of sample No. 15.

It is evident from Table 2 that in sample No. 15 wherein the atomic ratio of Fe to rare earth elements in raw material A exceeds 2.0, no substantial anisotropy of magnetostriction is observed and the magnetostriction (=81) is small. FIG. 4 relating to sample No. 15 shows that the peak in (111) plane and the peak in (222) plane are greater in the perpendicular ($\perp$) direction, with orientation along [111] axis being observed, but peaks attributable to an iron-rich hetero-phase (Tb,Dy)Fe$_3$ appeared. In the X-ray diffraction patterns of sample Nos. 13 and 14, orientation along [111] axis was observed.

Sample Nos. 16 to 19

Figure 5:
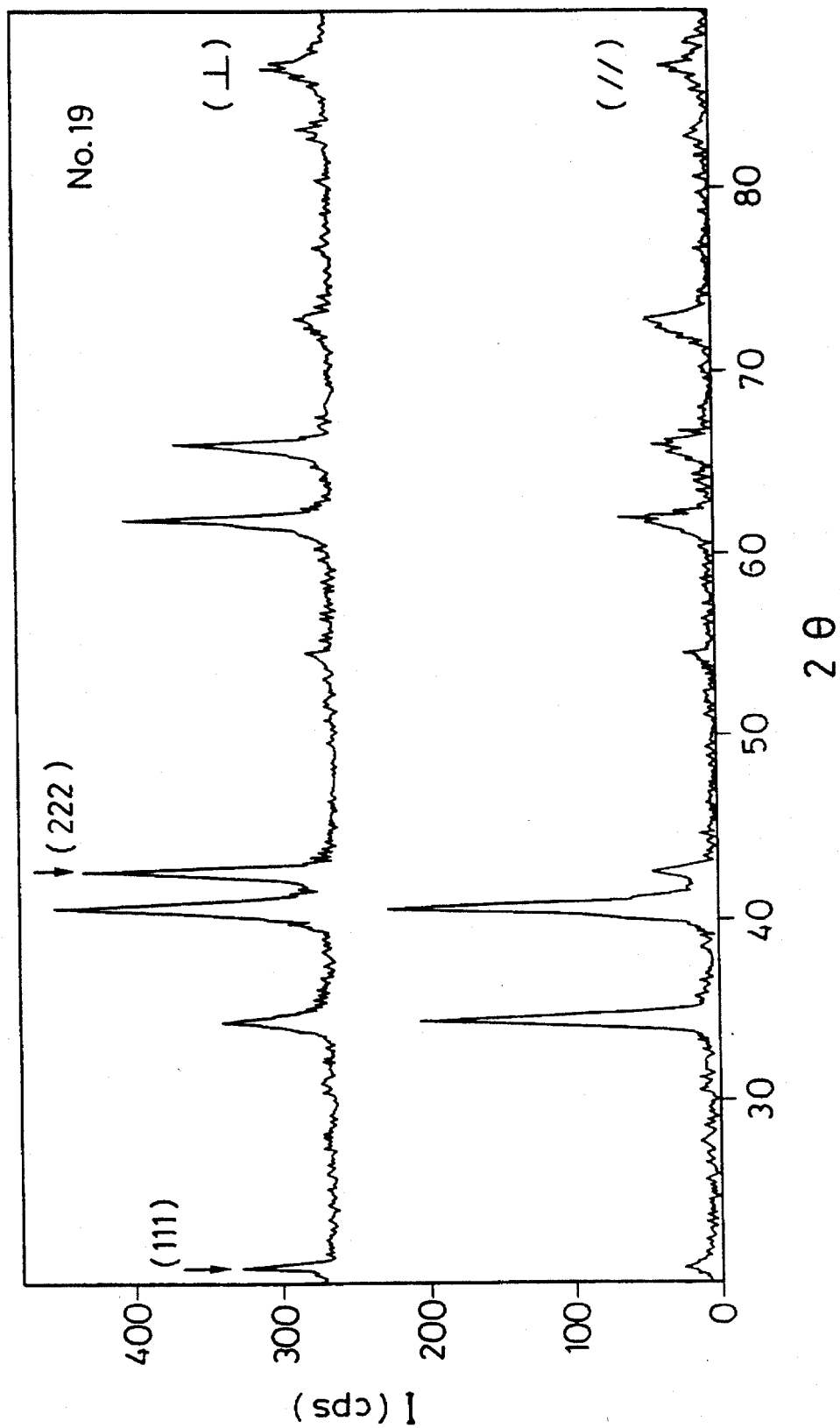

Sample Nos. 16 to 18 were prepared by the same procedure as sample No. 6 in Table 1 except that at least a part of Fe in raw material B was replaced by Co or Ni. Sample No. 19 was prepared by the same procedure as sample No. 6 in Table 1 except that 10 at% of Fe in raw material A was replaced by Co, the entirety of Fe in raw material B was replaced by Co, and the mixing ratio of the raw materials was changed. FIG. 5 shows the X-ray diffraction patterns of sample No. 19.

It is evident from Table 2 that replacement of Fe by Co or Ni in raw material B led to greater magnetostriction. This is because owing to this replacement, raw material B became more easily pulverizable and thus had a lower oxygen content in powder form. FIG. 5 shows that sample No. 19 had grains oriented along [111] axis. In the X-ray diffraction patterns of sample Nos. 16 to 18, orientation along [111] axis was observed.

Sample Nos. 20 to 22

Figure 6:
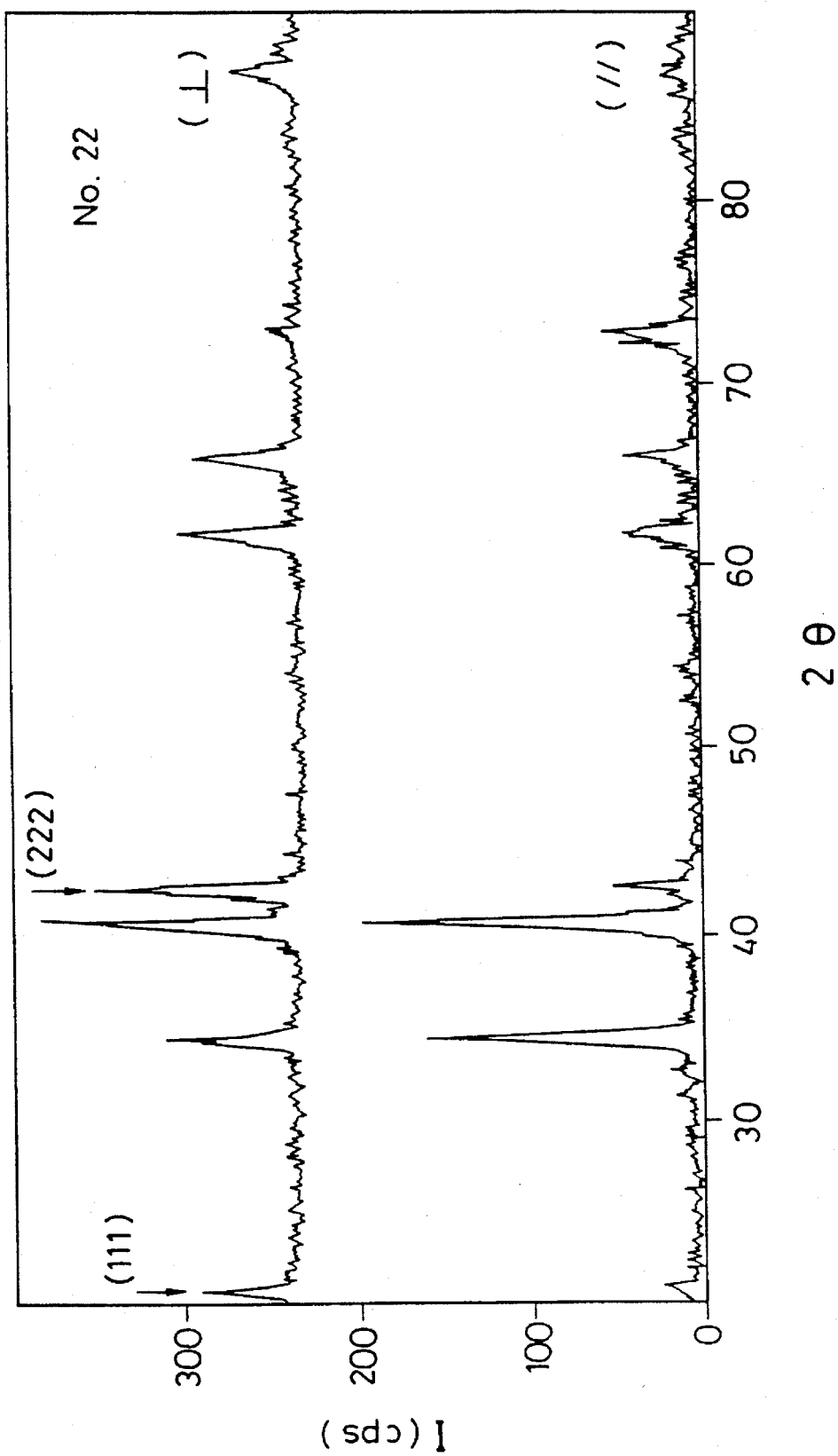

These samples had the highest atomic ratio of Tb relative to rare earth elements in the final composition. These samples were prepared by the same procedure as sample No. 6 in Table 1 except for the composition of raw material A and the mixing ratio of raw materials. FIG. 6 shows the X-ray diffraction patterns of sample No. 22.

It is evident from Table 2 that these samples exhibited anisotropic magnetostriction. FIG. 6 shows that sample No. 22 had grains oriented along [111] axis. In the X-ray diffraction patterns of sample Nos. 20 and 21, orientation along [111] axis was observed.

Sample No. 23

Figure 7:
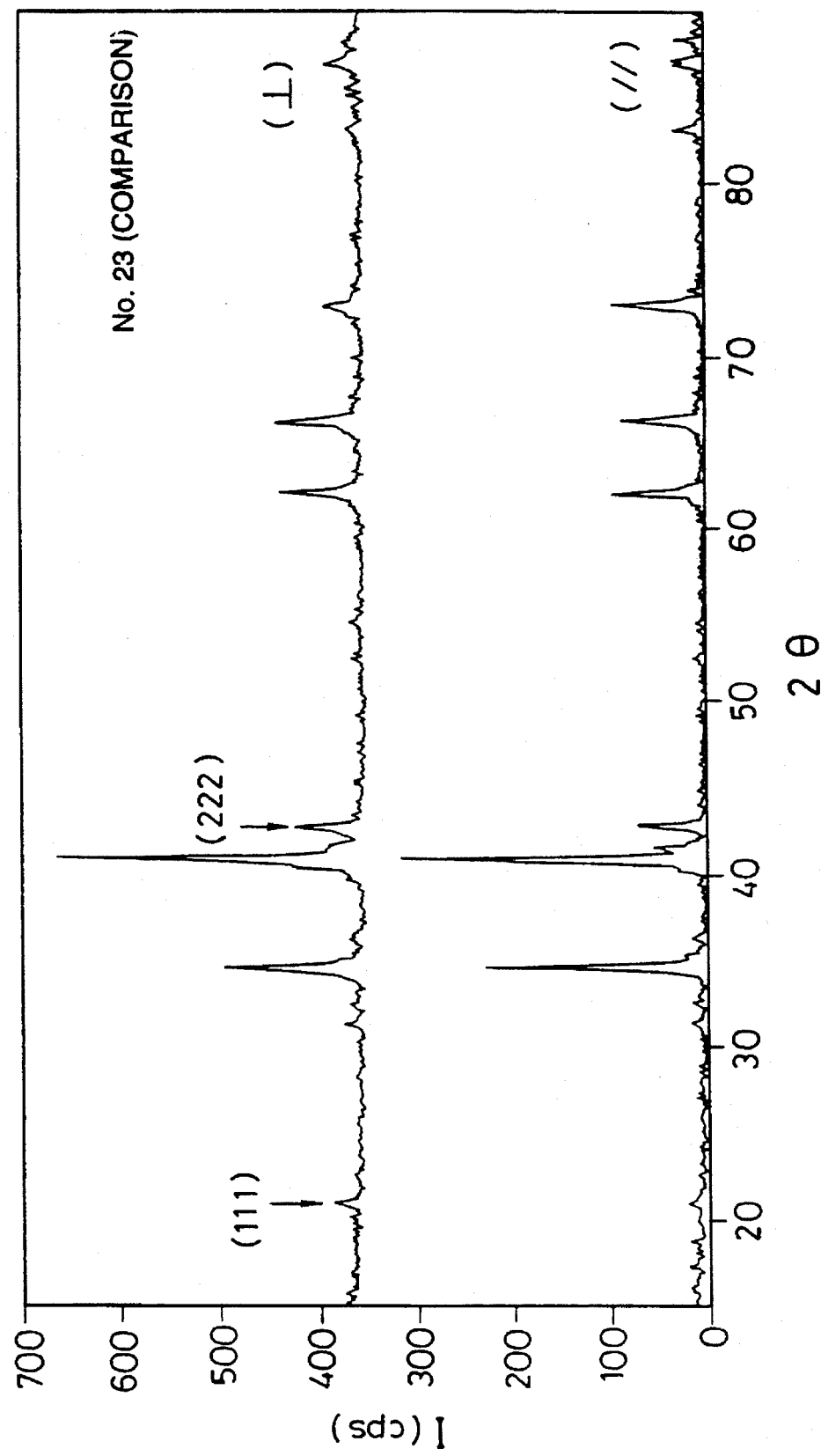

This sample was prepared pursuant to USP 4,152,178 using solely Tb$_{0.3}$Dy$_{0.7}$Fe$_{1.9}$ as the raw material. FIG. 7 shows the X-ray diffraction patterns of this sample. In this sample, no anisotropy of magnetostriction was observed as seen from Table 2 and no orientation along [111] axis was observed as seen from FIG. 7.

Sample No. 24

Figure 8:
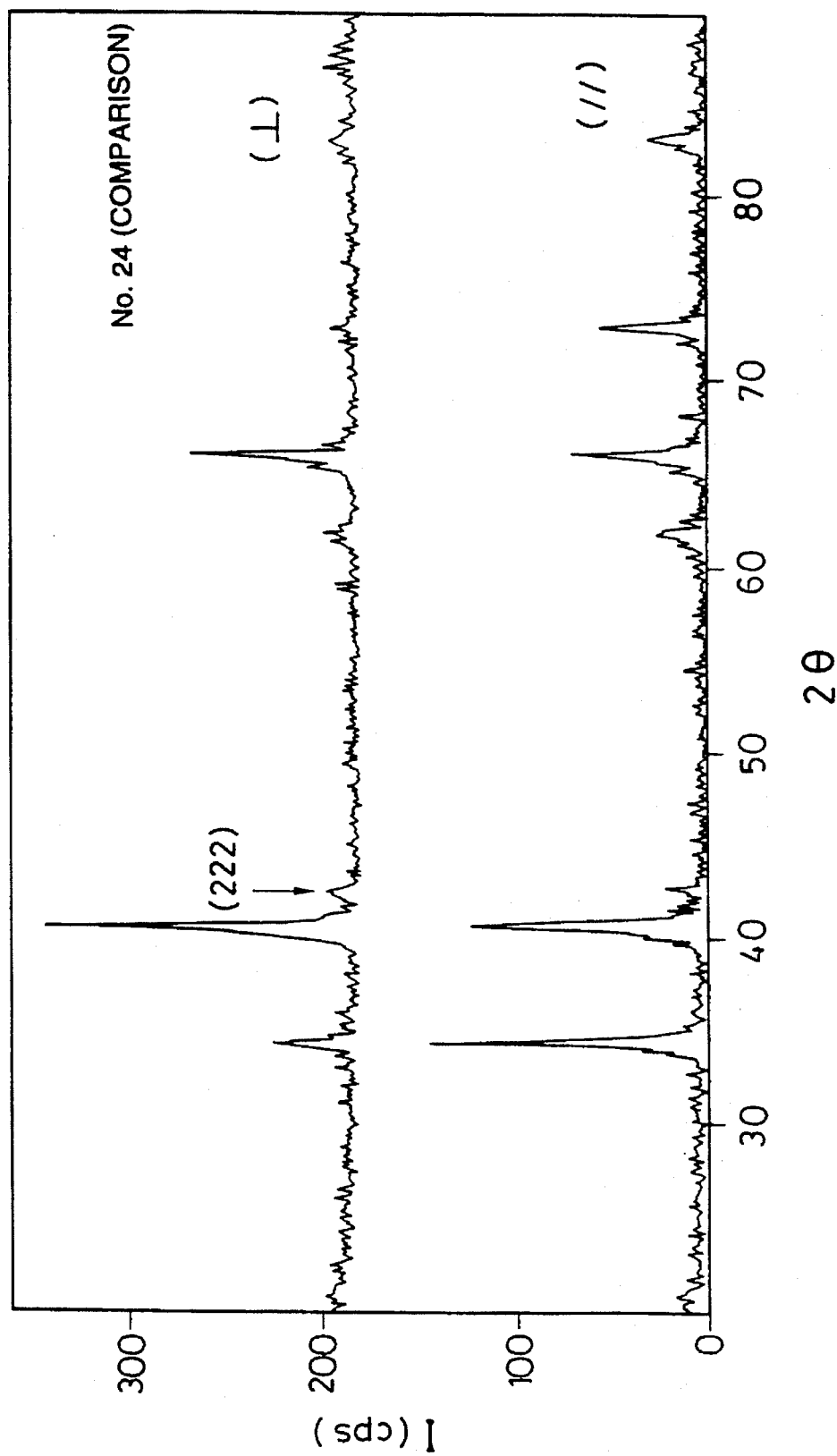

This sample was prepared pursuant to JP-A 180943/1989 by mixing TbFe$_{1.9}$ and DyFe$_{1.9}$ so as to give the final composition Tb$_{0.3}$Dy$_{0.7}$Fe$_{1.9}$. FIG. 8 shows the X-ray diffraction patterns of this sample. In this sample, no anisotropy of magnetostriction was observed as seen from Table 2 and no orientation along [111] axis was observed as seen from FIG. 8. The perpendicular magnetostriction ($\perp$) is significantly greater than the parallel magnetostriction ($\|$) probably because of the influence of [100] axis orientation of DyFe$_2$ grains.

Note that orientation along [111] axis was observed when at least a part of dysprosium in raw material B was replaced by holmium and when up to 20 at% of dysprosium in raw material A was replaced by holmium in the inventive samples. Also in additional examples wherein up to 30 at% of dysprosium in raw material B was replaced by terbium, by increasing the mixing ratio of raw material B, a desired final composition could be obtained with possible orientation along [111] axis.

Japanese Patent Application No. 104786/1994 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A method for preparing a magnetostrictive material having a composition of the formula:

$$(Tb_vDy_{1-v})T_w \qquad (III)$$

wherein T is at least one metal selected from the group consisting of Fe, Co, and Ni, and letters v and w representative of atomic ratios are in the range: $0.27 \leq v < 0.50$ and $1.70 \leq w \leq 2.00$, comprising the steps of compacting a mixture containing powder raw material A, powder raw material B and optionally, powder raw material C consisting essentially of element T in a magnetic field, and sintering the resulting compact, said raw material A having a composition of the formula:

$$(Tb_xDy_{1-x})T_y \quad (I)$$

wherein T is as defined above and letters x and y representative of atomic ratios are in the range: $0.30<x\leq0.50$ and $1.70\leq y\leq2.00$, said raw material B having a composition of the formula:

$$(DY_{1-t}Tb_t)_zT_{1-z} \quad (II)$$

wherein T is as defined above and letters t and z representative of atomic ratios are in the range: $0\leq t\leq0.30$ and $0.40\leq z\leq0.80$.

2. The method of claim 1 wherein dysprosium in raw material A and/or dysprosium in raw material B is at least partially replaced by holmium.

3. The method of claim 1 wherein in said mixture, a representative of a weight percentage of raw material A, b representative of a weight percentage of raw material B, and c representative of a weight percentage of raw material C are in the range:

$50\leq a<100$, $0<b\leq40$, $0\leq c\leq20$, and $a+b+c=100$.

4. The method of claim 1 wherein the magnetostrictive material is obtained as a polycrystalline body having [111] axis orientation.

* * * * *

UNITED STATES PATENT AND TRADEMARK OFFICE
CERTIFICATE OF CORRECTION

PATENT NO. : 5,529,745
DATED : June 25, 1996
INVENTOR(S) : Teruo MORI, et al.

It is certified that error appears in the above-identified patent and that said Letters Patent is hereby corrected as shown below:

Column 11, line 10, "$(DY_{1-t}Tb_t)_zT_{1-z}$" should read -- $(Dy_{1-t}Tb_t)_zT_{1-z}$ --.

Signed and Sealed this

Ninth Day of December, 1997

Attest:

BRUCE LEHMAN

Attesting Officer

Commissioner of Patents and Trademarks